United States Patent [19]
Bartig et al.

[11] Patent Number: 5,495,358
[45] Date of Patent: Feb. 27, 1996

[54] OPTICAL TRANSCEIVER WITH IMPROVED RANGE AND DATA COMMUNICATION RATE

[75] Inventors: Kevin W. Bartig, Corvallis, Oreg.; Richard D. Crawford, Los Altos, Calif.

[73] Assignee: Hewlett-Packard Company, Palo Alto, Calif.

[21] Appl. No.: 979,749

[22] Filed: Nov. 23, 1992

[51] Int. Cl.$^6$ .......................... H04B 10/06; H04B 14/08
[52] U.S. Cl. .......................... 359/189; 359/152; 359/135
[58] Field of Search .................................. 359/124, 123, 359/135, 148, 152, 161, 180–182, 189, 194

[56] References Cited

U.S. PATENT DOCUMENTS

| | | |
|---|---|---|
| 3,867,628 | 2/1975 | Brown . |
| 3,902,060 | 8/1975 | Neuner et al. . |
| 3,968,361 | 7/1976 | Bumgardner .......................... 250/551 |
| 4,213,119 | 7/1980 | Ward .................................... 340/151 |
| 4,449,206 | 5/1984 | Tokitsu et al. ......................... 365/229 |
| 4,628,541 | 12/1986 | Beavers ................................. 375/96 |
| 4,654,892 | 3/1987 | Ely .................................... 250/214 A |
| 4,783,137 | 11/1988 | Kosman et al. ........................ 250/227 |
| 4,817,208 | 3/1989 | Koch ..................................... 359/189 |
| 4,837,556 | 6/1989 | Matsushita et al. .................... 340/310 R |
| 4,856,090 | 8/1989 | Kitani et al. . |
| 4,885,804 | 12/1989 | Mayle . |
| 5,075,792 | 12/1991 | Brown et al. ............................ 341/69 |

FOREIGN PATENT DOCUMENTS

| | | |
|---|---|---|
| 0102815 | 3/1984 | European Pat. Off. ............... 359/186 |
| 3136565A1 | 4/1983 | Germany . |
| 2247798 | 3/1992 | United Kingdom . |
| WO88/00780 | 1/1988 | WIPO . |
| WO92/14322 | 8/1992 | WIPO . |

OTHER PUBLICATIONS

Dance, "Multichannel Remote Control Systems", Electron (GB) No. 153 pp. 33–34, 37 7 Nov. 1978.
HP95LX Wired Serial and Infrared I/O External Reference Specification by Kevin W. Bartig, Hewlett-Packard, Apr. 11, 1991.

Primary Examiner—Leslie Pascal

[57] ABSTRACT

An IR transceiver for use in low-power, low cost environments such as portable computers and hand-held calculators. The transceiver can transmit data at higher, selectable baud rates and at greater distances than previously possible. On the transmitting side the transceiver elements include a serial interface device, encoder circuitry and an IR transmitter with LEDS having fast turn-on and turn-off times. On the receiving side are decoder circuitry coupled to the serial interface device and an IR receiver designed specifically for a photo diode. A baud rate generator provided by the serial interface device sets the baud rate in the encoding and decoding circuitry. The receiver portion of the IR transceiver automatically sets itself to the baud rate of received data. Because of the baud rate selectability, the IR transceiver is compatible with prior IR transceivers that are limited to fixed baud rates.

21 Claims, 3 Drawing Sheets

OPTICAL TRANSCEIVER WITH IMPROVED RANGE AND DATA COMMUNICATION RATE

BACKGROUND OF THE INVENTION

This invention relates generally to optical communication devices. More particularly, this invention relates to a low power optical transceiver for use in portable computers, calculators and other devices to send and receive a data stream across greater distances and at higher data communication rates than has been previously possible.

Communicating information optically between two devices has distinct advantages over the more conventional technique of using a physical connection such as a cable. Optical communication is more convenient because it does not require the presence of a cable nor the effort to connect the two devices together. Moreover, optical communication does not suffer from electromagnetic radiated noise or provide a path for destructive electrostatic discharge (ESD) as in the case of wires.

Optical transceivers (devices which can both transmit and receive optical communications) have been successfully incorporated into a number of portable computing devices for communicating data between such devices and others such as computers and printers. U.S. Pat. No. 5,075,792, for example, describes a low power optical transceiver for use in portable computing devices such as hand-held calculators. A similar optical transceiver, but using a photo diode instead of a photo transistor, is incorporated into the HP95LX palm-top computer from Hewlett-Packard Company.

However, these optical transceivers and others in the prior art have inherent limitations in their range and transmission rates. Typically, such transceivers can transmit only three to ten inches (7.6 to 25 cm) at a fixed, relatively low baud rate such as 2400 baud. (The baud rate is the number of signalling units per second. In many cases, the baud rate is equivalent to the number of bits per second.) Their limited range affects the convenience of use, and the low baud rate increases the time and power required to transmit data. Moreover, the fixed baud rate may render an optical transceiver incompatible with newer devices that operate at different transmission rates.

SUMMARY OF THE INVENTION

Accordingly, an object of the invention is to provide an improved optical transceiver with increased range and data communication rate.

Another object of the invention is to provide an improved optical transceiver with selectable data communication rates for matching the rate of other devices the transceiver is communicating with.

An optical transceiver in accordance with the invention comprises a serial interface device, an encoder, an optical transmitter, an optical receiver and a decoder. The serial interface device transmits and receives a serial bit stream at a selectable baud rate determined by a selectable baud rate of a clock signal. On the transmitting side, an encoder encodes the serial bit stream into electrical pulses. An optical transmitter then transforms the electrical pulses into light pulses. On the receiving side, an optical transceiver receives light pulses and transforms them into electrical pulses. A decoder then decodes the light pulses into a serial bit stream for the serial interface device.

The optical receiver may include a photo diode for receiving the light pulses and converting them into electrical pulses and an amplifier for amplifying the electrical pulses. A high pass filter filters out lower frequency pulses and a converter then converts the filtered pulses into pulses having predetermined digital signal levels. Preferably, the converter comprises a comparator, although equivalent devices may also be used. The high pass filter may comprise several transistors and a capacitor connected in a feedback loop.

The encoder and decoder may each utilize counters responsive to the clock signal for encoding and decoding data at the selected baud rate.

The foregoing and other objects, features, and advantages of the invention will become more apparent from the following detailed description of a preferred embodiment which proceeds with reference to the accompanying drawings.

DESCRIPTION OF A PREFERRED EMBODIMENT

Figure 1:
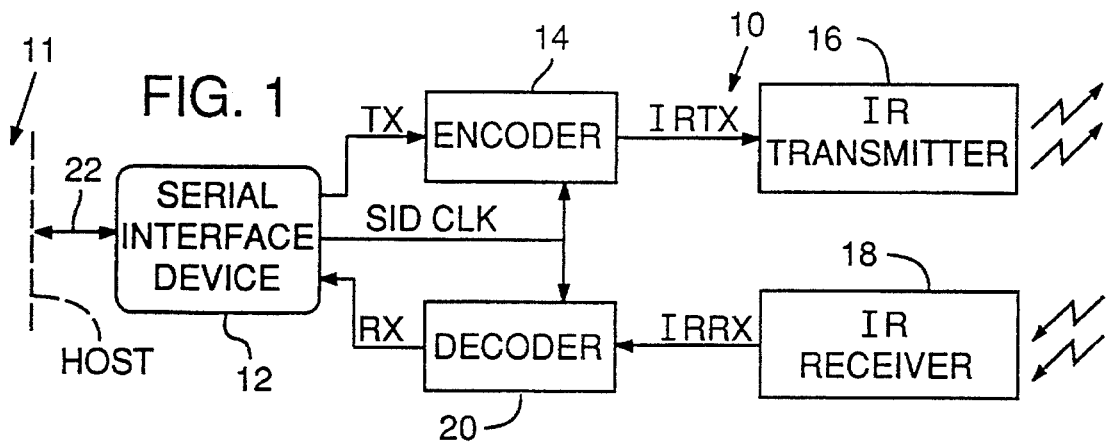
FIG. 1 is a block diagram of an optical transceiver according to the invention.

Referring now to FIG. 1 of the drawings, there is shown a functional block diagram of an optical transceiver 10 according to the invention. The transceiver 10 may be incorporated into a host device 11 such as a calculator, palm-top or notebook sized computer or may be a physically separate device if desired. The components of the transceiver 10 include a programmable serial interface device (SID) 12 such as a 16550 or 16450 UART (universal asynchronous receiver and transmitter) from National Semiconductor. Technically equivalent interface devices include but are not limited to universal synchronous and asynchronous receiver and transmitters (USARTs), asynchronous communications interface adapters (ACIAs), serial input/out (SIO) devices, data link controllers, multiple protocol communications controllers and serial communications controllers.

The serial interface device 12 receives data from the host device 11 (typically in parallel format) through a serial output location and transmits an equivalent serial bit stream TX to encoder circuitry 14. The encoder circuitry 14 transforms the bits into electrical pulses IRTX that occupy less than the full bit time and passes them to an optical transmitter such as an infrared transmitter 16. The transmitter 16 transforms the electrical pulses into infrared light pulses and broadcasts the light pulses at a selected baud rate. The receiving side of the optical transceiver 10 includes an optical receiver such as an IR receiver 18 that receives similar light pulses from another transmitter and transforms them into electrical pulses IRRX. The receiver passes these electrical pulses to decoder circuitry 20 for decoding into a serial bit stream RX. The decoder circuitry 20 in turn routes the bit stream to a serial input location on the serial interface device 12 for communication to the host device 11. The optical transceiver 10 preferably operates in half-duplex mode, i.e., with only the transmitter 16 or receiver 18 active at any given time, to prevent the transceiver from receiving the data it transmits. However, with additional shielding, the transceiver 10 could be operated in full-duplex mode, i.e., both the transmitter and receiver simultaneously active.

The serial interface device 12 includes an internal programmable baud rate generator for transmitting the serial bit stream at selectable baud rates up to 115,200 baud. The serial bit stream generated by the device 12 is in a nonreturn-to-zero format with logic one bits at a higher voltage level such as +5v and logic zero bits at ground level such as 0v, each bit pulse occupying the full bit time. The device 12 also includes a SID clock that runs at a multiple of the baud rate such as 16, 32 or 64 times as fast for clocking the encode and decoder circuitry 14 and 20, for reasons to be described. An operator of the host device 11 can thus select one of a number of possible baud rates and communicate that choice to the device 12 through control lines represented by bidirectional bus 22. The bus 22 also carries data and addresses between the host device 11 and optical transceiver 10.

Figure 2:
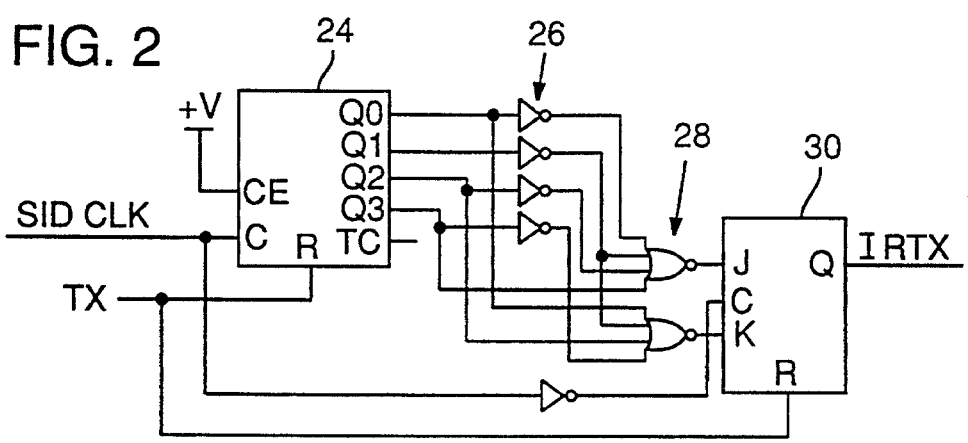
FIG. 2 is a schematic diagram of an encoder portion of the optical transceiver.

FIG. 2 is a schematic diagram of a preferred form of the encoder circuitry 14. The encoder 14 includes a four-bit synchronous counter 24 that is clocked by the SID clock and reset by logic one bits in the serial bit stream TX. The counter 14 responds to a logic zero in the serial bit stream by counting and responds to a logic one by resetting. Coupled to the output of the counter 24 is logic circuitry comprising a set of inverters 26 followed by a set of NOR gates 28 and a JK flip flop 30. The logic circuitry is configured to create an electrical pulse of 3/16 of the bit time (three SID clock signals) delayed 1/2 of a bit time after the counter begins a new count. This delay insures that a true zero bit and not a "glitch" has been sent to the counter reset pin; otherwise, the counter resets when the glitch disappears. Thus, zero bits cause the encoder 14 to generate electrical pulses with a high logic level voltage (the counter is allowed to count), while one bits cause the encoder to generate no pulse, i.e., pulses with a low logic level voltage (the counter is reset).

Figure 3:
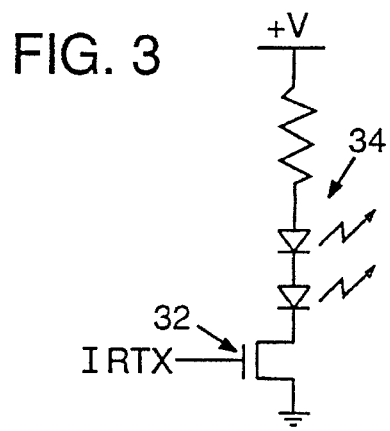
FIG. 3 is a schematic diagram of an IR transmitter portion of the optical transceiver.

FIG. 3 shows a preferred form of the optical transmitter 16, which can transmit light pulses at up to 115,200 baud. The logic level voltages of the encoded electrical pulses IRTX are applied to the gate of a field effect transistor (FET) 32 with low gate capacitance for switching on and off rapidly. A small "on" resistance is also desirable. A suitable FET is the Siliconix Si9942DY. The FET 32 is a switch for turning on and off a pair of infrared LEDs 34, which provide a wider communications cone and greater range than a single LED. LEDs 34 are chosen with on and off times preferably no greater than 500 nanoseconds to achieve the maximum desired baud rate. A suitable LED is the Telefunken TSIP 5201 that transmits with a wavelength of 950 nanometers. The transmitter 16 transforms the electrical pulses IRTX into light pulses that can be detected from zero to 3 feet (one meter) or more by a highly sensitive receiver such as IR receiver 18.

Figure 6:
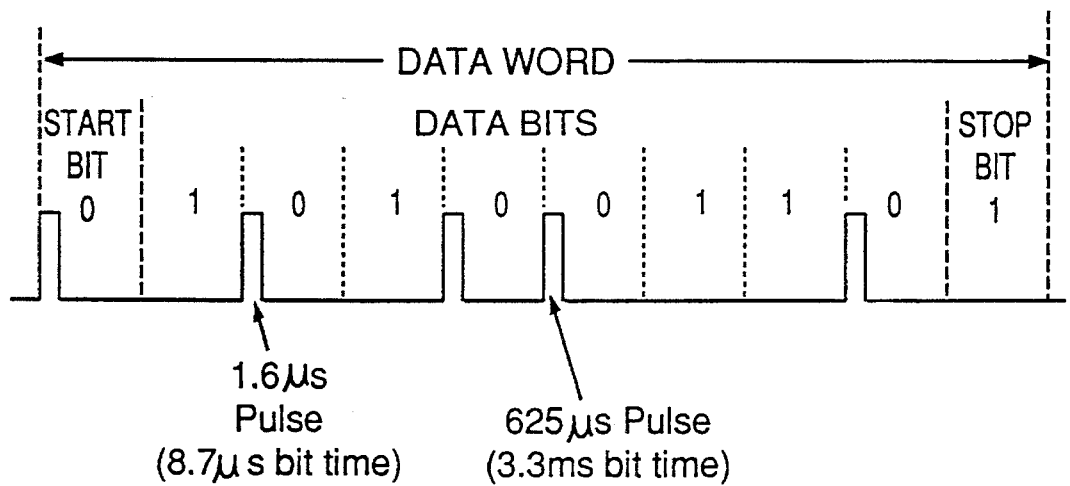
FIG. 6 is a timing diagram showing the data encoding format employed with the optical transceiver.

FIG. 6 is a timing diagram showing the data encoding format just described as the data is transmitted by LEDs 34. Each data word includes a start bit, five to eight data bits with optional parity, and a stop bit. Each zero bit is signaled by sending a pulse and each one bit is signaled by sending no pulse. With a selectable baud rate from the SID clock, each pulse may be as short as 1.6 microseconds within an 8.7 microsecond bit time (115,200 baud) or as long as 625 microseconds within a 3.3 millisecond bit time (300 baud) or even longer. The data words are transmitted using a conventional data protocol such as Kermit, which may include error correction codes, framing information, etc. Kermit is well known and is amply described in works such as Kermit, a File Transfer Protocol (1987).

Figure 4:
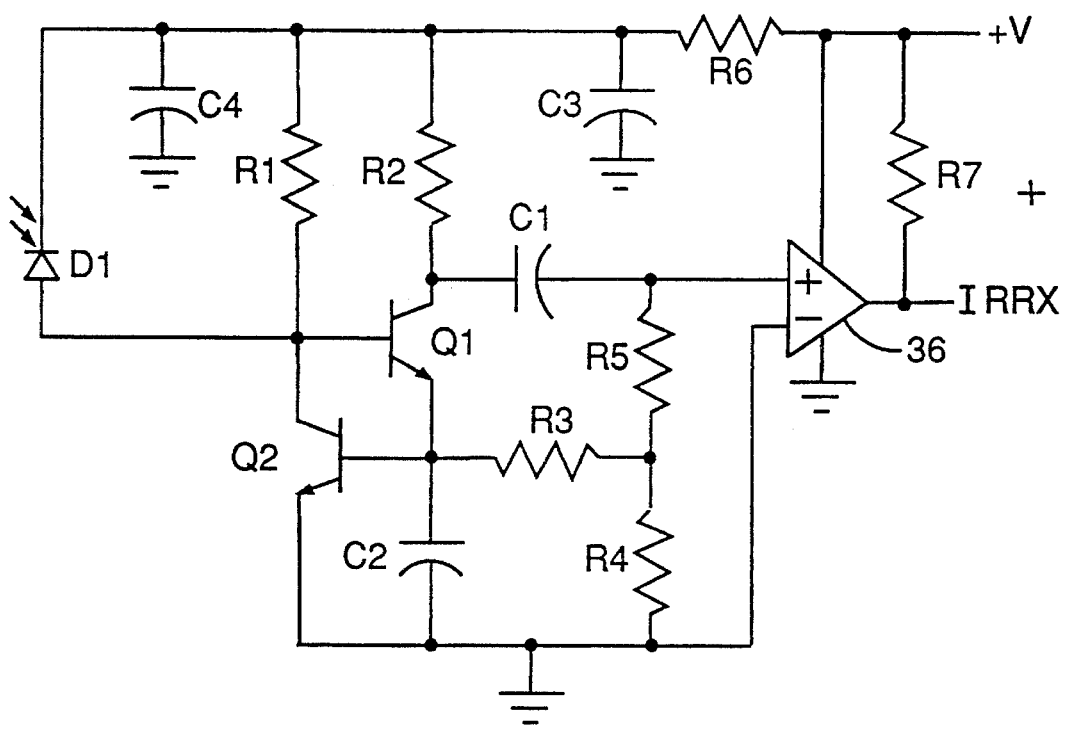
FIG. 4 is a schematic diagram of an IR receiver portion of the optical receiver.

FIG. 4 is a schematic diagram of a preferred form of IR receiver 18 for receiving light pulses transmitted at various baud rates. Infrared light pulses are received by a reverse-biased photo diode D1 and converted into electrical current pulses. A preferred photo diode is the Telefunken BPV22F, which has a visible light filter and a peak wavelength of 950 nanometers. The current pulses are amplified and inverted by transistor Q1 and AC coupled through capacitor C1 to the noninverting input of a low-power comparator 36. Comparator 36 serves to transform the electrical pulses into digital signal level pulses, such as +5v and 0v. Specifically, the comparator 36 compares the voltage of the inverted pulses to a reference voltage (ground in this embodiment). If the pulse voltage is of sufficient magnitude to drive the voltage at the noninverting input below ground (indicating a logic zero), then the comparator output is driven low and IRRX is a low logic signal. Equivalently, a high gain transistor amplifier with a ground reference could be used in place of comparator 36. The comparator 36, high gain amplifier and other equivalent devices are a means for converting the electrical pulses into pulses having the desired digital signal levels.

A high pass filter in the form of a feedback circuit is used in the receiver 18 to filter out low frequency pulses produced by ambient light (such as produced by turning on an incandescent light). The pulses from transistor Q1 are fed back through resistor R3 to the base of transistor Q2, which biases diode D1 with DC current. Higher frequency pulses are filtered out of this feedback loop by capacitor C2, while lower frequency pulses increase the share of photo diode current that transistor Q2 diverts from the base of transistor Q1.

Other elements in the receiver 18 are used for setting the comparator's noise margin and for supply voltage filtering. Resistor R4 sets the DC bias on the noninverting input of the comparator 36 and thus the noise margin of the receiver circuit. Increasing the resistance of R4 lessens the sensitivity to noise, but it also shortens the receiver's range. Resistor R6 and capacitors C3 and C4 are used for filtering the supply voltage +V.

Figure 5:
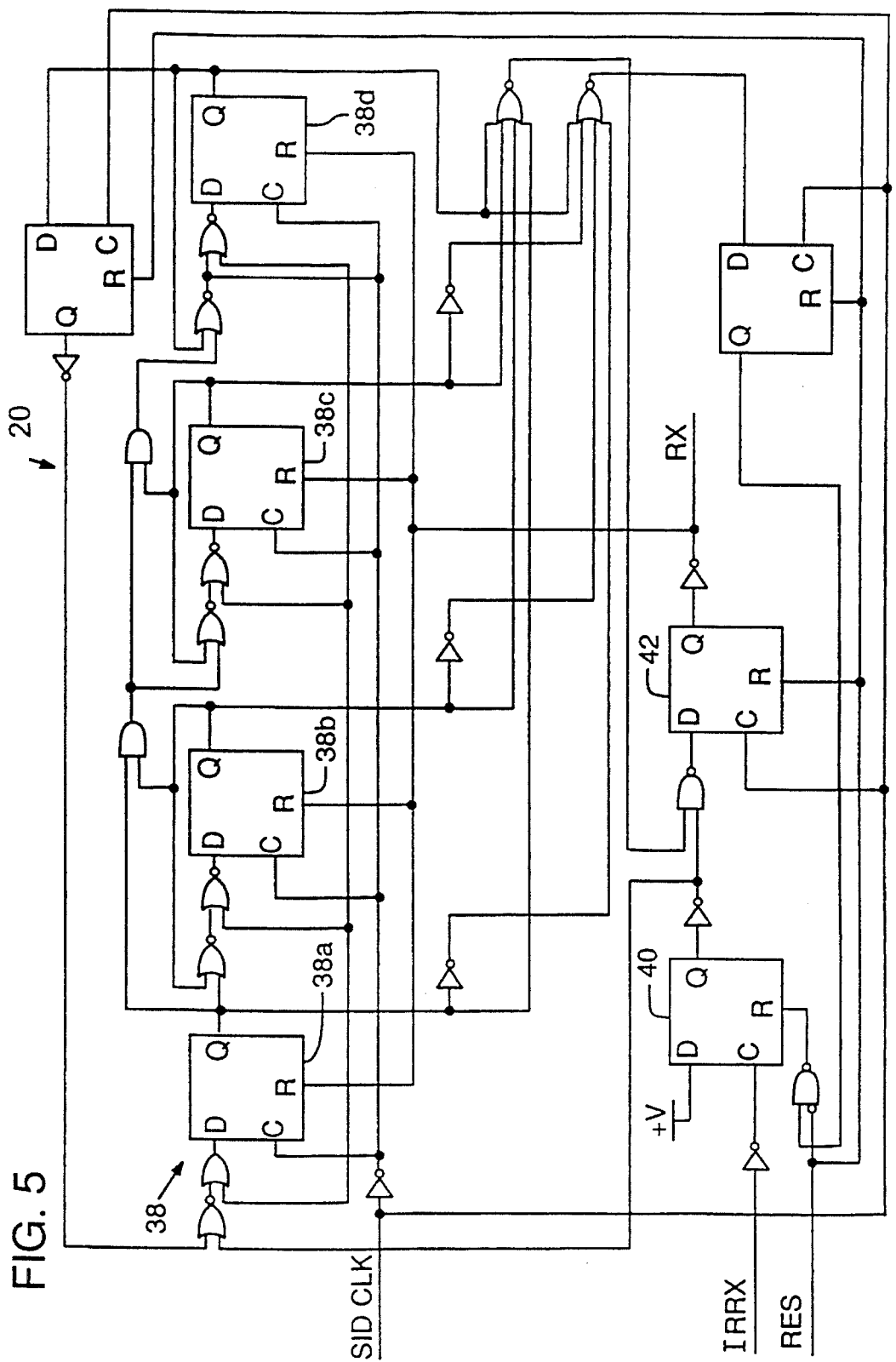
FIG. 5 is a schematic diagram of a decoder portion of the optical transceiver.

FIG. 5 is a schematic diagram of a preferred form of the decoder circuit 20. The input signals to the decoder 26 are the electrical pulses IRRX from the IR receiver 18, the SID clock signal from the serial interface device 12 and a reset signal RES from the host device 11 to reset the decoder on power up. The decoder 20 includes a 4-bit counter 38 comprised of flip flops 38a–d, an input flip flop 40, an output flip flop 42 and related logic gates. The rising edge of an incoming pulse (indicating a logic zero) sets the input flip flop 40. The output of the flip flop 40 forms the input to the counter 38, which is clocked at the SID clock rate (16 times the baud rate) and begins to count. The counter reaches its maximum count in one bit time. Simultaneously, the output of the flip flop 40 is applied to the flip flop 42 to generate a logic zero for RX. When the counter 38 reaches an eight count, it resets the flip flop 40 to await the arrival of another pulse. If another pulse occurs before the counter 38 expires, the counter is synchronously reset and RX remains a logic zero. If no following pulse is received (indicating a logic one), the counter 38 expires after one bit time, resetting the output flip flop 42 and forcing RX to a logic one. The decoder circuit 14 then remains in this state until another pulse arrives at the input flip flop 40.

Thus each pulse indicating a logic zero is stretched to an entire bit time and the pulses overall are transformed into a serial bit stream having a nonreturn-to-zero format. Bits in the stream persist for 16 SID clock cycles so that they are generated at the selected baud rate. The output RX is then shifted into the serial interface device 12 at the selected baud rate, converted to parallel format and routed to the host 11.

Having illustrated and described the principles of the invention preferred embodiments, it should be apparent to those skilled in the art that the invention can be modified in arrangement and detail without departing from such principles. For example, discrete or integrated circuits of various types and depths of integration may be employed for the elements of the optical transceiver, as is known to those of skill in the art. For example, the encoder and decoder circuitry may be implemented on an ASIC chip along with the serial interface device. Such circuits could also be implemented in programmable or standard logic devices. Features of the invention shown in hardware may also be implemented in software. Those features in software may be implemented in hardware.

Therefore, the illustrated embodiment should be considered only an example of the invention and not a limitation on the scope of the following claims. We therefore claim all modifications and equivalents to the illustrated embodiment coming within the scope and spirit of these claims. The words of these claims are to be given their ordinary and accustomed meaning to one of skill in the art, unless it clearly appears that we intend to use them differently.

We claim:

1. An optical communication device for receiving serial communication at various selectable baud rates, comprising:
   a photo diode for receiving light pulses and converting the light pulses into electrical pulses;
   a first bipolar transistor having its base coupled to the photo diode for amplifying the electrical pulses;
   a high pass filter for filtering out lower frequency amplified electrical pulses, the filter comprising:
   a second bipolar transistor having its collector coupled to the base of the first transistor and the photo diode, and having its base coupled to the emitter of the first transistor; and
   a capacitor coupled at one end to the emitter of the first transistor and the base of the second transistor and coupled at the other end to ground; and
   a converter for converting the filtered pulses into digital pulses having predetermined digital signal levels.

2. The optical communication device of claim 1 wherein the converter comprises a comparator for comparing the electrical pulses with a reference value to transform the pulses into digital pulses with digital signal levels.

3. The optical communication device of claim 2 wherein the reference value is ground voltage.

4. The optical communication device of claim 1 wherein the high pass filter comprises a feedback circuit for feeding the lower frequency pulses back to the photo diode to divert such pulses away from the amplifier.

5. The optical communication device of claim 1 including a decoder for converting the digital signal level pulses provided by the converter into digital signals occupying the full bit time for each bit according to a selected baud rate.

6. The optical communication device of claim 5 wherein the decoder includes a counter for counting at one of various selectable clock rates toward a predetermined count corresponding to a full bit time, thereby transforming the pulses into a serial bit stream.

7. The optical communication device of claim 1 including:
   a baud rate generator for generating a clock signal at one of a number of selectable baud rates; and
   means responsive to the clock signal generated at the selected baud rate for converting the digital pulses into a stream of bits having the selected baud rate.

8. A method of receiving optically serial communication at various baud rates, comprising the following steps:
   providing a photo detector for receiving light pulses and converting the light pulses to electrical pulses;
   amplifying the electrical pulses;
   filtering lower frequency electrical pulses out of the electrical pulses by feeding back the lower frequency pulses to the amplifier;
   generating a clock signal at one of a number of baud rates selectable by a control signal;
   with the clock signal generated at the selected baud rate, converting the electrical pulses into a stream of bits having the selected baud rate.

9. The method of claim 8 including comparing the electrical pulses from the photo detector with a reference value to transform the electrical pulses into digital pulses with digital signal levels.

10. An optical communication transceiver for receiving and sending serial communication at various selectable baud rates, comprising:
    (a) a serial interface device for transmitting and receiving a serial bit stream at a baud rate selectable by a control signal;
    (b) an encoder for encoding the serial bit stream from the serial interface device into electrical pulses, the serial bit stream having a baud rate set by the serial interface device;
    (c) an optical transmitter coupled to the encoder for transforming the electrical pulses of the encoder into light pulses for transmission;
    (d) an optical receiver for receiving light pulses and transforming them into electrical pulses; and
    (e) a decoder for decoding the electrical pulses from the optical receiver into a serial bit stream for the serial interface device, the serial bit stream having a baud rate set by the serial interface device.

11. The optical communication device of claim 10 wherein the serial interface device includes a selectable clock signal that determines the baud rate.

12. The optical communication device of claim 10 wherein the serial interface device is a UART.

13. A method of communicating information optically, comprising:
    electronically selecting a baud rate;
    generating a serial bit stream at the selected baud rate, each bit occupying its full bit time;
    encoding the serial bit stream into electrical pulses, each pulse occupying a fraction of the serial bit time; and
    driving an LED with the electrical pulses to generate light pulses.

14. The method of claim 13 including:
    receiving a series of light pulses with a photo diode and transforming them into electrical pulses; and
    decoding the electrical pulses into a serial bit stream having a selected baud rate.

15. An optical communication device for receiving serial communication at various baud rates, comprising:

a photo detector for receiving light pulses and converting the light pulses to electrical pulses;

a converter for converting the electrical pulses into digital pulses;

a baud rate generator for generating a clock signal at one of a number of baud rates selectable by a control signal; and means responsive to the clock signal generated at the selected baud rate for converting the digital pulses into a stream of bits having the selected baud rate.

16. The optical communication device of claim 15 wherein the means for converting the digital pulses into a stream of bits is adapted to produce a bit stream having a nonreturn-to-zero format.

17. The optical communication device of claim 15 wherein the bit stream produced by the means for converting the digital pulses is a serial bit stream and the optical communication device includes a serial interface device for converting the serial bit stream to a parallel format.

18. The optical communication device of claim 15 wherein the photo detector is a photo diode.

19. The optical communication device of claim 15 wherein the converter comprises a comparator for comparing the electrical pulses from the photo detector with a reference value to transform the electrical pulses into the digital pulses.

20. The optical communication device of claim 15 including an amplifier comprising a first transistor having its base coupled to the photo detector and its collector AC coupled to the converter.

21. The optical communication device of claim 15 including:

an amplifier comprising a first bipolar transistor;

a high pass filter comprising a second bipolar transistor having its collector coupled to the base of the first transistor and the photo detector, and having its base coupled to the collector of the first transistor; and a capacitor coupled at one end to the emitter of the first transistor and the base of the second transistor and coupled at the other end to ground, the first and second transistors forming a feedback path for feeding lower frequency pulses back toward the photo detector to divert such pulses away from the base of the first transistor and into the collector of the second transistor and the capacitor for filtering higher frequency pulses out of the feedback path.

* * * * *